(12) United States Patent
Kuroda et al.

(10) Patent No.: US 7,262,851 B2
(45) Date of Patent: Aug. 28, 2007

(54) METHOD AND APPARATUS FOR DETECTING RELATIVE POSITIONAL DEVIATION BETWEEN TWO OBJECTS

(75) Inventors: Ryo Kuroda, Kawasaki (JP); Yasuhisa Inao, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 296 days.

(21) Appl. No.: 11/166,106

(22) Filed: Jun. 27, 2005

(65) Prior Publication Data
US 2006/0007440 A1   Jan. 12, 2006

(30) Foreign Application Priority Data
Jun. 29, 2004   (JP) .............................. 2004-192252

(51) Int. Cl.
*G01B 11/00*   (2006.01)
(52) U.S. Cl. ..................................... 356/401
(58) Field of Classification Search ......... 356/399–401
See application file for complete search history.

(56) References Cited

U.S. PATENT DOCUMENTS

| | | | |
|---|---|---|---|
| 3,768,911 A * | 10/1973 | Erickson ..................... | 356/619 |
| 4,815,850 A * | 3/1989 | Kanayama et al. .......... | 356/488 |
| 5,162,656 A | 11/1992 | Matsugu et al. ............. | 250/548 |
| 5,294,980 A | 3/1994 | Matsugu et al. ............. | 356/401 |
| 5,325,176 A | 6/1994 | Suda et al. .................. | 356/356 |
| 5,327,221 A | 7/1994 | Saitoh et al. ................ | 356/355 |
| 5,508,527 A | 4/1996 | Kuroda et al. ........... | 250/491.1 |
| 5,722,905 A | 3/1998 | Bidelman ................... | 473/451 |
| 6,171,730 B1 | 1/2001 | Kuroda et al. .................. | 430/5 |
| 6,334,960 B1 | 1/2002 | Willson et al. ............... | 216/52 |
| 6,628,392 B2 | 9/2003 | Kuroda et al. .............. | 356/400 |
| 7,001,696 B2 | 2/2006 | Inao et al. ..................... | 430/5 |
| 2002/0071106 A1 | 6/2002 | Yano et al. ................... | 355/53 |
| 2004/0080732 A1 | 4/2004 | Kuroda et al. ................ | 355/53 |
| 2005/0064303 A1 | 3/2005 | Yamada et al. ................ | 430/5 |
| 2006/0003233 A1 | 1/2006 | Yamaguchi et al. ........... | 430/5 |

OTHER PUBLICATIONS

Flanders, D.C., et al. "A new interferometric alignment technique," presented in *Applied Physics Letters*, vol. 31, No. 7, Oct. 1, 1997. pp. 426-428.

* cited by examiner

*Primary Examiner*—Richard A. Rosenberger
(74) *Attorney, Agent, or Firm*—Fitzpatrick, Cella, Harper & Scinto

(57) ABSTRACT

Disclosed is a method and apparatus for detecting a relative positional deviation between first and second objects. In one preferred form of the invention, the detecting method includes the steps of (i) providing the first and second objects with diffraction gratings, respectively, each having a grating pitch larger than a wavelength of a light source used, (ii) placing the first and second objects so that a dielectric material layer having a thickness smaller than the wavelength of the light source used is interposed between the first and second objects, and so that the diffraction gratings of the first and second objects are opposed to each other, (iii) projecting light from the light source onto the diffraction gratings of the first and second objects, and (iv) detecting the relative positional deviation between the first and second objects on the basis of diffraction light projected from the diffraction gratings to a space.

10 Claims, 4 Drawing Sheets

METHOD AND APPARATUS FOR DETECTING RELATIVE POSITIONAL DEVIATION BETWEEN TWO OBJECTS

FIELD OF THE INVENTION AND RELATED ART

This invention relates to a method and an apparatus for detecting a relative positional deviation between two objects. More particularly, the invention concerns a technique for detecting a positional deviation very precisely where a mold or a photomask to be used in near-field lithography or optical nanoimprint lithography should be aligned with a substrate to be exposed or a workpiece to be processed.

In semiconductor exposure apparatuses, relative alignment of a mask or a reticle with a wafer is carried out in various ways, and examples are a method in which marker patterns on a mask or a reticle and on a wafer are observed through a microscope optical system and a relative positional deviation between them is detected by image processing, and a method in which a mark or a reticle and a wafer are provided with diffraction patterns, respectively, and a relative positional deviation between them is detected on the basis of interference of diffraction lights produced from lights incident on these diffraction gratings, as discussed by Flanders et al. in Appl. Phys. Lett. Vol. 31, p426 (1977).

On the other hand, the lithographic technology has been advanced and diversified, and novel lithographic method have been proposed as emerging lithographic technology, such as step and flush imprint lithography (hereinafter, "optical nanoimprint lithography") as disclosed in U.S. Pat. No. 6,334,960, or near-field optical lithography as disclosed in U.S. Pat. No. 6,171,730.

In accordance with such advanced lithographic methods, a pattern of a size of 100 nm or under can be produced. In these methods, a mold or a photomask is brought into close proximity to a substrate to be exposed or a workpiece to be processed, to an order of 500 nm or under (typically, not greater than 200 nm), and the information that the mold or photomask bears is transferred to the substrate.

As regards relative alignment between a photomask or a mold with a substrate to be exposed or a workpiece to be processed, in such advanced lithographic methods, a novel positional deviation detecting system should be provided to enable detection of a positional deviation more precisely while being adapted to a structure that the clearance between the photomask or mold and the substrate to be exposed or workpiece to be processed is 500 nm or under.

SUMMARY OF THE INVENTION

It is accordingly an object of the present invention to provide a method and/or an apparatus for detecting a relative positional deviation between two objects more precisely.

In accordance with an aspect of the present invention, there is provided a method of detecting a relative positional deviation between first and second objects, said method comprising the steps of: providing the first and second objects with diffraction gratings, respectively, each having a grating pitch larger than a wavelength of a light source used; placing the first and second objects so that a dielectric material layer having a thickness smaller than the wavelength of the light source used is interposed between the first and second objects, and so that the diffraction gratings of the first and second objects are opposed to each other; projecting light from the light source onto the diffraction gratings of the first and second objects; and detecting the relative positional deviation between the first and second objects on the basis of diffraction light projected from the diffraction gratings to a space.

In accordance with another aspect of the present invention, there is provided an apparatus for detecting a relative positional deviation between first and second objects, said apparatus comprising: a light source having a predetermined wavelength; diffraction gratings provided on the first and second objects, respectively, each having a grating pitch larger than the wavelength of the light source used, the first and second objects being disposed so that the diffraction gratings of the first and second objects are opposed to each other; a dielectric material layer disposed between the first and second objects and having a thickness smaller than the wavelength of the light source; and detecting means for detecting diffraction light produced in response to projection of light from the light source onto the diffraction gratings of the first and second objects and for detecting the relative positional deviation between the first and second objects on the basis of diffraction light projected from the diffraction gratings to a space.

In these aspects of the present invention, one of the first and second objects may be a photomask while the other may be a substrate to be exposed, and the dielectric material layer may be a photosensitive material layer.

Alternatively, one of the first and second objects may be an optical nanoimprint mold while the other may be a substrate to be processed, and the dielectric material layer may be a curing resin layer.

Briefly, in accordance with the present invention, a relative positional deviation detecting method and/or a relative positional deviation detecting system by which a positional deviation between two objects can be detected more precisely even in a structure wherein the two objects are placed very close to each other with a clearance of 500 nm or under.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Initially, the principle of detecting a relative positional deviation between two objects in the present invention will be explained with reference to FIGS. 1A-1C.

Figure 1A:
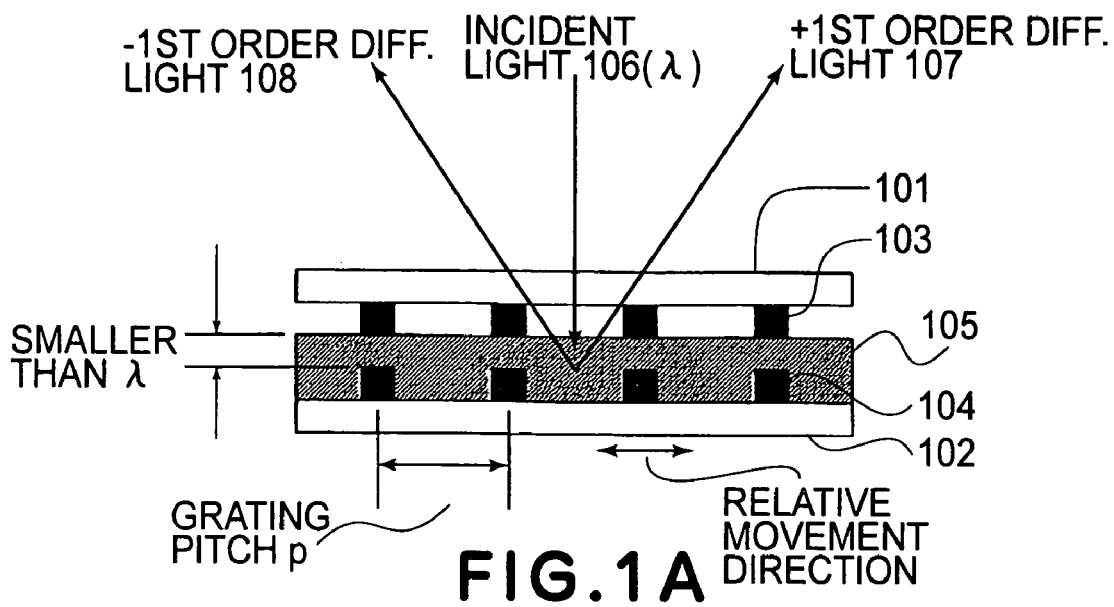
FIGS. 1A-1C are schematic views, respectively, for explaining the principle of detecting a relative positional deviation between two objects, in an embodiment of the present invention.
Figure 1B:
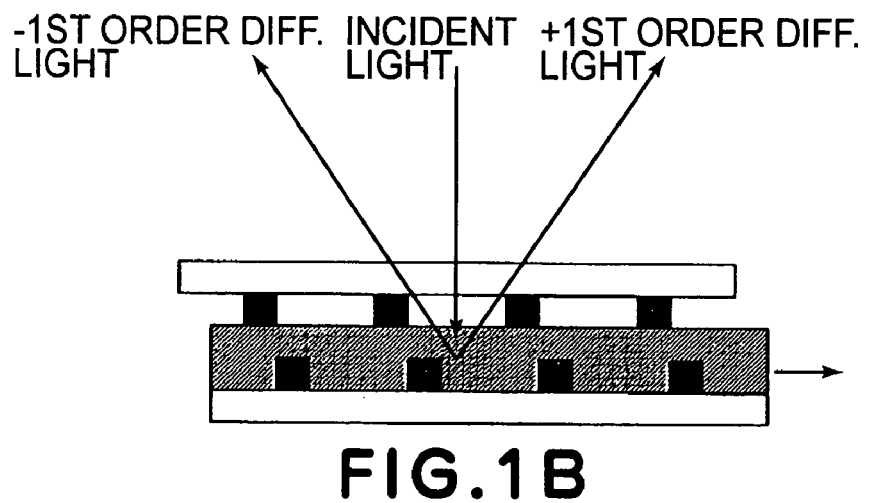
Figure 1C:
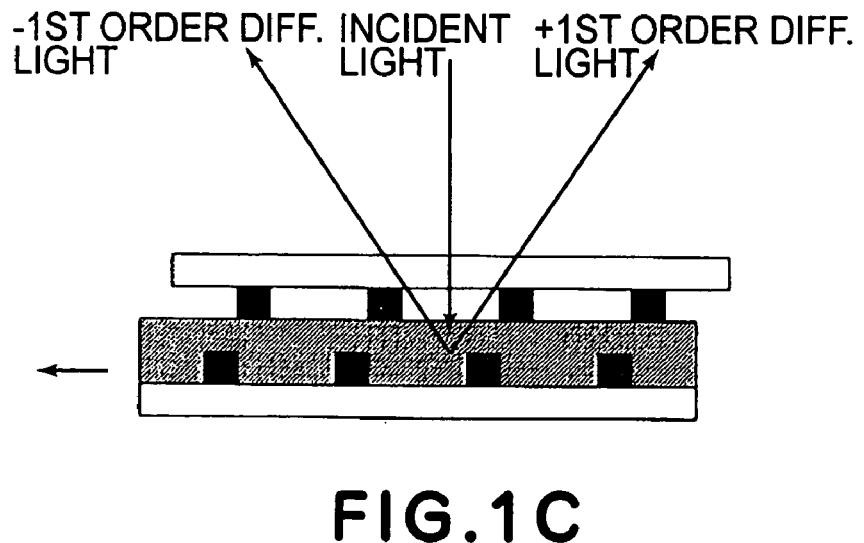

In FIGS. 1A-1C, a first object A (101) and a second object B (102) which are the subjects of relative positional deviation detection are provided with diffraction gratings A (103) and B (104), respectively. Each of these diffraction gratings A and B (103 and 104) has a grating pitch p which is made greater than the wavelength λ of light of a light source, to be described later. Furthermore, on the second object B (102), there is a dielectric material thin film 105 which is formed with a thickness smaller than the wavelength of the light source used.

Here, the first object A (101) may be a mold in optical nanoimprint lithography or a photomask in near-field optical lithography, for example. The second object B (102) may be a workpiece or substrate to be processed in optical nanoimprint lithography or a substrate to be exposed in near-field optical lithography, for example. In these cases, the dielectric material thin film 105 may be made of an ultraviolet-ray setting (curing) resin or a photoresist, for example.

The first object A (101) and the second object B (102) are disposed so that, upon the upper surface of the dielectric material thin film 105, the diffraction gratings A (103) and B (104) of them are opposed to each other. Here, the dielectric material thin film 105 is interposed between the diffraction gratings A (103) and B (104), and these diffraction gratings are disposed with a clearance not greater than the wavelength of light from the light source.

In operation, light (incident light) 106 having a wavelength λ from the light source is incident on the diffraction gratings A (103) and B (104), and the light intensities of positive first (+1st) order diffraction light 107 and negative first (−1st) order diffraction light 108 from the diffraction gratings A and B are measured. Here, since the clearance between the diffraction gratings A (103) and B (104) is made smaller than the wavelength of incident light, as far as the incident light concerns, these diffraction gratings can serve as a single integral diffraction grating through the action of near-field light, being present adjacent the respective diffraction gratings, rather than two independent diffraction gratings.

In FIG. 1A, between the diffraction gratings A (103) and B (104), there is no phase shift of diffraction gratings in the relative movement direction (lateral direction as viewed in the drawing). Therefore, the positive first (+1st) order diffraction light and the negative first (−1st) order diffraction light have the same intensity.

On the other hand, FIGS. 1B and 1C shows cases wherein the diffraction grating B (104) has a rightward positional deviation and a leftward positional deviation with reference to the diffraction grating A (102), respectively. In these cases, there is a phase difference between the diffraction gratings A and B, such that, in relation to the incident light, the diffraction gratings A (103) and B (104) can serve, as a unit, as a diffraction grating having an asymmetric shape in lateral direction, such as a blazed diffraction grating, for example. In these cases, the positive first (+1st) order diffraction light 107 and the negative first (−1st) order diffraction light have different intensities. Thus, by measuring the difference in intensity, the difference in phase between the diffraction gratings A (103) and B (104), namely, the relative positional deviation in lateral direction between the first object A (101) and the second object B (102) can be detected.

Figure 2:
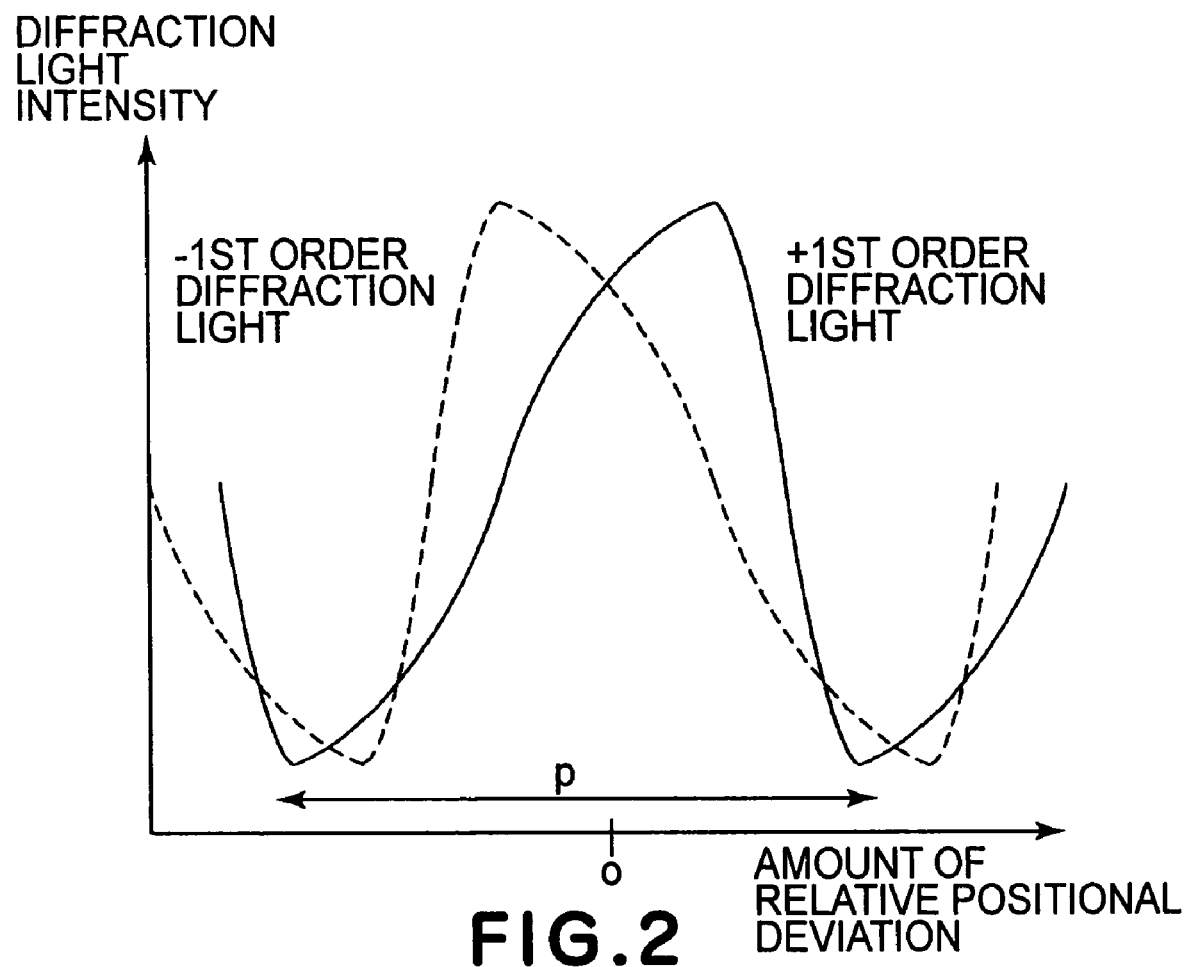
FIG. 2 is a graph for explaining the relationship between a relative positional deviation of two objects and a diffraction light intensity, in an embodiment of the present invention.

FIG. 2 shows the relationship between the relative positional deviation amount and the diffraction light intensity change.

It is seen from FIG. 2 that, if the amount of relative positional deviation is zero, the positive first (+1st) order diffraction light and the negative first (−1st) order diffraction light have the same intensity, and that, in accordance with the relative positional deviation, the intensity of these diffraction lights changes. The period of change is equal to the pitch p of the diffraction grating.

Next, specific examples of the present invention will be explained.

EXAMPLE 1

Example 1 is an embodiment wherein a detecting system of the present invention for detecting a relative positional deviation between two objects is applied to constitute a near-field lithography apparatus.

Figure 3:
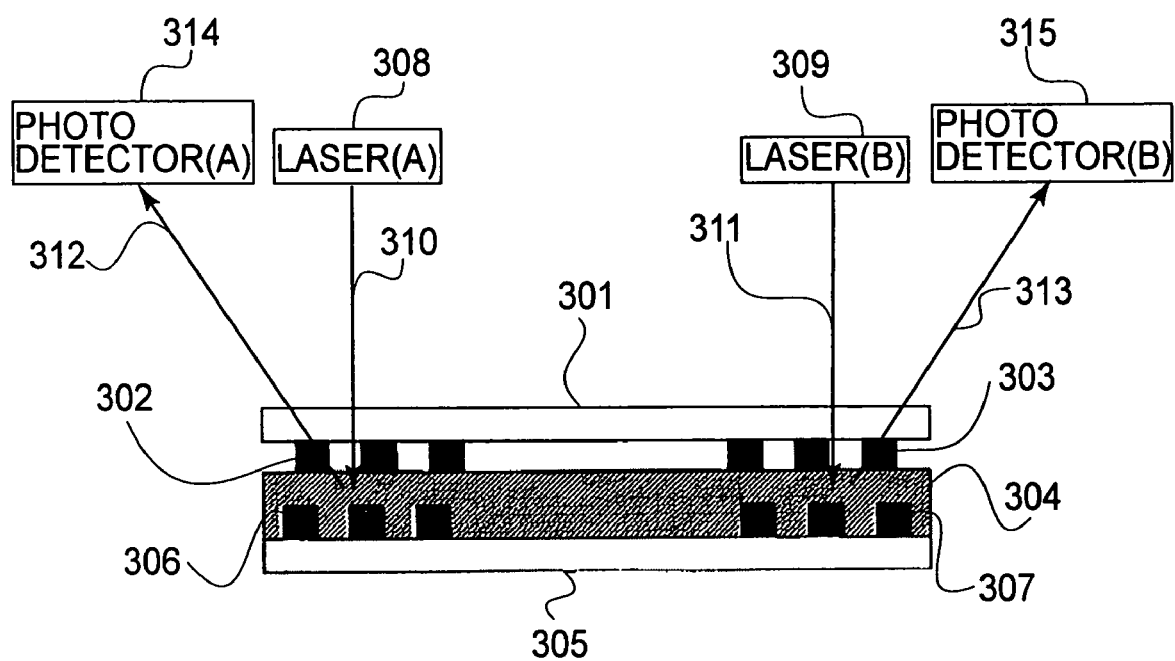
FIG. 3 is a schematic and diagrammatic view, showing a general structure of a relative positional deviation detecting system in a near-field lithography apparatus according to Example 1 of the present invention.

FIG. 3 shows a general structure of a relative positional deviation detecting system incorporated into a near-field optical lithography apparatus, according to this example.

In FIG. 3, a photomask 301 for near-field optical lithography is provided with a left-hand side diffraction grating A (302) and a right-hand side diffraction grating C (303). A wafer 305 which is a substrate to be exposed is coated with a photoresist 304 with a thickness of 200 nm or under, and the wafer is provided with a left-hand side diffraction grating B (306) and right-hand side diffraction grating D (307). The diffraction gratings A and B (302 and 306) as well as the diffraction gratings C and D (303 and 307) are disposed close to each other and opposed to each other with the photoresist 304 interposed therebetween.

There are a laser A (308) and a laser B (309) which provide incident light A (310) and incident light B (311) both of a wavelength 635 nm. These incident lights A and B (310 and 311) from the lasers A and B are incident on the diffraction gratings A and B and the diffraction gratings C and D, respectively. Then, the intensity of negative first (−1st) order diffraction light 312 and the intensity of negative first (−1st) order diffraction light 313 are detected by using a photodetector A (314) and a photodetector B (315), respectively. Thus, on the basis of detection signals produced by the photodetectors A and B (314 and 315), the amount of relative positional deviation between the photomask 301 and the wafer 304 can be detected.

EXAMPLE 2

Example 2 is an embodiment in which a detecting system of the present invention for detecting a relative positional deviation between two objects is applied to constitute an optical nanoimprint lithography apparatus.

Figure 4:
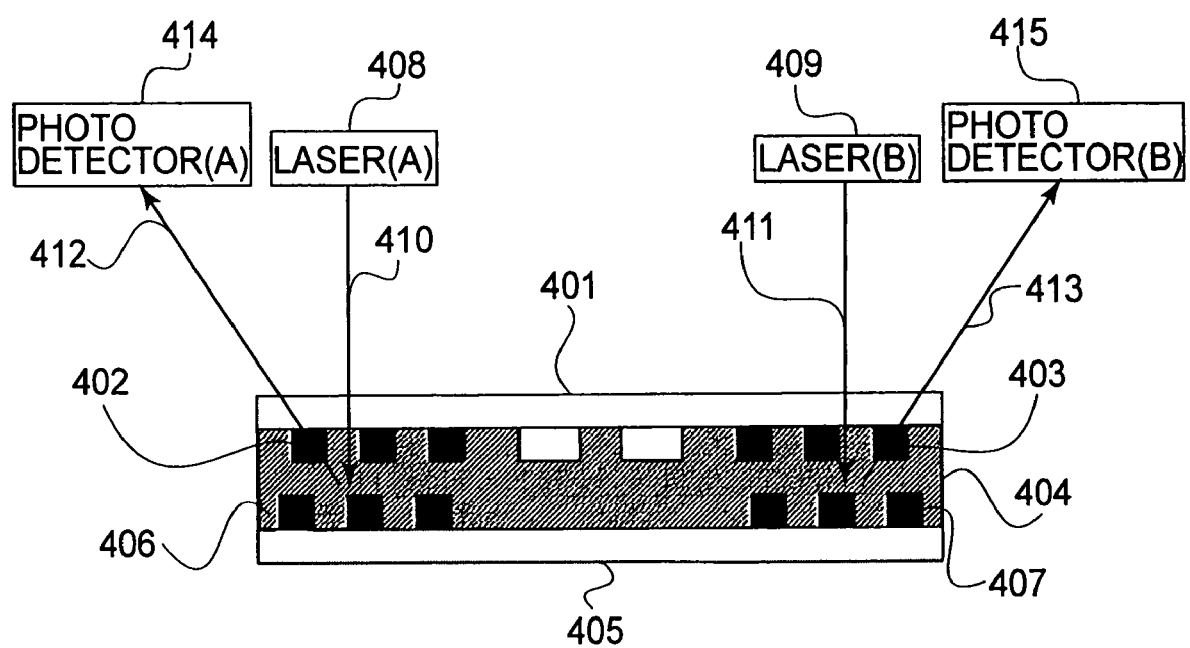
FIG. 4 is a schematic and diagrammatic view, showing a general structure of a relative positional deviation detecting system in an optical nanoimprint lithography apparatus according to Example 2 of the present invention.

FIG. 4 shows a general structure of a relative positional deviation detecting system incorporated into an optical nanoimprint lithography apparatus, according to this example.

In FIG. 4, a mold 401 for optical nanoimprint lithography is provided with a left-hand side diffraction grating A (402) and a right-hand side diffraction grating C (403). A wafer 405 which is a workpiece substrate to be processed is coated with an ultraviolet-ray setting resin liquid 404 with a thickness of 200 nm or under, and the wafer is provided with a left-hand side diffraction grating B (406) and right-hand side diffraction grating D (407). The diffraction gratings A and B (402 and 406) as well as the diffraction gratings C and D (403 and 407) are disposed close to each other and opposed to each other with the UV setting resin 404 interposed therebetween.

There are a laser A (408) and a laser B (409) which provide incident light A (410) and incident light B (411) both of a wavelength 635 nm. These incident lights A and B (410 and 411) from the lasers A and B are incident on the diffraction gratings A and B and the diffraction gratings C and D, respectively. Then, the intensity of negative first (−1st) order diffraction light 412 and the intensity of negative first (−1st) order diffraction light 413 are detected by using a photodetector A (414) and a photodetector B (415), respectively. Thus, on the basis of detection signals produced by the photodetectors A and B (414 and 415), the amount of relative positional deviation between the mold 401 and the wafer 404 can be detected.

Although this example has been explained with reference to a mold for optical nanoimprint lithography and an UV setting resin, the concept of the present invention can be applied also to a system using a nanoimprint lithography mold and a thermosetting resin, as disclosed in U.S. Pat. No. 5,772,905.

Although Examples 1 and 2 described above have been explained with reference to a case where one-dimensional diffraction gratings are used, the present invention is not limited to this. Two-dimensional diffraction gratings may be used, for example. As regards such two-dimensional diffraction grating, a concentric diffraction grating such as Fresnel zone plate may be used, for example. In that occasion, there would be an additional advantage that, as well as a periodic relative positional deviation detection signal, an absolute positional deviation detection signal is obtainable.

Furthermore, although Examples 1 and 2 described above have been explained with reference to a case where diffraction lights from left-hand side and right-hand side pairs of diffraction gratings (A and B; and C and D) are detected respectively and the intensities of them are compared, it would be understood form FIGS. 3 and 4 that, by shifting the phase of the diffraction gratings, the peak position of the signal from the paired diffraction gratings can be shifted. Thus, the structure may be arranged appropriately to provide a detection system suitable to a required condition, such as differential detection type, for example.

In accordance with the embodiments and examples of the present invention as described above, two objects whose relative positional deviation is going to be detected are provided with two diffraction gratings while a dielectric material layer having a thickness smaller than the wavelength of detection light is provided therebetween. The detection light is projected to the diffraction gratings, and diffraction light from these two diffraction gratings which serve like a single integral diffraction grating through the action of near-field light being present adjacent the diffraction gratings, is detected. On the basis of this, the amount of relative positional deviation between the two objects can be detected very precisely.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-192252 filed Jun. 29, 2004, for which is hereby incorporated by reference.

What is claimed is:

1. A method of detecting a relative positional deviation between first and second objects, said method comprising the steps of:
    providing the first and second objects with diffraction gratings, respectively, each having a grating pitch larger than a wavelength of a light source used;
    placing the first and second objects so that a dielectric material layer having a thickness smaller than the wavelength of the light source used is interposed between the first and second objects, and so that the diffraction gratings of the first and second objects are opposed to each other;
    projecting light from the light source onto the diffraction gratings of the first and second objects; and
    detecting the relative positional deviation between the first and second objects on the basis of diffraction light projected from the diffraction gratings to a space.

2. A method according to claim 1, wherein the first and second objects are provided with plural pairs of diffraction gratings, the diffraction gratings in each pair being disposed opposed to each other, and wherein light from the light source is incident on the plural pairs of diffraction gratings and diffraction light projected from the plural pairs of diffraction gratings to the space is detected.

3. A method according to claim 1, wherein each of the diffraction gratings is a two-dimensional diffraction grating.

4. A method according to claim 1, wherein one of the first and second objects is a photomask while the other is a substrate to be exposed, and wherein the dielectric material layer is a photosensitive material layer.

5. A method according to claim 1, wherein one of the first and second objects is an optical nanoimprint mold while the other is a substrate to be processed, and wherein the dielectric material layer is a curing resin layer.

6. An apparatus for detecting a relative positional deviation between first and second objects, said apparatus comprising:
    a light source having a predetermined wavelength;
    diffraction gratings provided on the first and second objects, respectively, each having a grating pitch larger than the wavelength of the light source used, the first and second objects being disposed so that the diffraction gratings of the first and second objects are opposed to each other;
    a dielectric material layer disposed between the first and second objects and having a thickness smaller than the wavelength of the light source; and
    detecting means for detecting diffraction light produced in response to projection of light from the light source onto the diffraction gratings of the first and second objects and for detecting the relative positional deviation between the first and second objects on the basis of diffraction light projected from the diffraction gratings to a space.

7. An apparatus according to claim 6, wherein the first and second objects are provided with plural pairs of diffraction gratings, the diffraction gratings in each pair being disposed opposed to each other, and wherein light from the light source is incident on the plural pairs of diffraction gratings and diffraction light projected from the plural pairs of diffraction gratings to the space is detected by said detecting means.

8. An apparatus according to claim 6, wherein each of the diffraction gratings is a two-dimensional diffraction grating.

9. An apparatus according to claim 6, wherein one of the first and second objects is a photomask while the other is a substrate to be exposed, and wherein the dielectric material layer is a photosensitive material layer.

10. An apparatus according to claim 6, wherein one of the first and second objects is an optical nanoimprint mold while the other is a substrate to be processed, and wherein the dielectric material layer is a curing resin layer.

* * * * *